(12) United States Patent
Bonges, III

(10) Patent No.: US 7,299,426 B2
(45) Date of Patent: Nov. 20, 2007

(54) SYSTEM AND METHOD TO IMPROVE CHIP YIELD, RELIABILITY AND PERFORMANCE

(75) Inventor: Henry A. Bonges, III, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 5 days.

(21) Appl. No.: 10/908,803

(22) Filed: May 26, 2005

(65) Prior Publication Data

US 2006/0271900 A1 Nov. 30, 2006

(51) Int. Cl.
*G06F 17/50* (2006.01)

(52) U.S. Cl. ............... 716/1; 716/10; 716/11

(58) Field of Classification Search ............ 716/1, 716/13–16, 8, 10, 11
See application file for complete search history.

(56) References Cited

U.S. PATENT DOCUMENTS

| | | | |
|---|---|---|---|
| 5,353,235 A * | 10/1994 | Do et al. | 716/14 |
| 5,883,564 A * | 3/1999 | Partin | 338/32 R |
| 6,441,319 B1 * | 8/2002 | Handforth et al. | 174/262 |
| 6,532,581 B1 | 3/2003 | Toyonaga et al. | |
| 6,587,991 B1 | 7/2003 | Mbouombouo et al. | |
| 6,618,846 B2 | 9/2003 | Cheng | |
| 6,662,250 B1 * | 12/2003 | Peterson | 710/100 |
| 6,732,338 B2 | 5/2004 | Crouse et al. | |
| 2001/0047508 A1 * | 11/2001 | Miura et al. | 716/8 |
| 2002/0184601 A1 | 12/2002 | Fitzhenry et al. | |
| 2003/0023937 A1 | 1/2003 | McManus et al. | |
| 2003/0088845 A1 * | 5/2003 | Teig et al. | 716/14 |
| 2003/0172358 A1 | 9/2003 | Alon et al. | |
| 2003/0182643 A1 | 9/2003 | Crouse et al. | |
| 2003/0200513 A1 | 10/2003 | Reuter et al. | |
| 2004/0251501 A1 * | 12/2004 | Catalasan et al. | 257/355 |
| 2005/0028125 A1 * | 2/2005 | Watanabe et al. | 716/13 |
| 2005/0138592 A1 * | 6/2005 | Morgan et al. | 716/12 |
| 2006/0031805 A1 * | 2/2006 | Fassnacht et al. | 716/12 |

* cited by examiner

*Primary Examiner*—Jack Chiang
*Assistant Examiner*—Suchin Parihar
(74) *Attorney, Agent, or Firm*—Ryan Simmons; Greenblum & Bernstein P.L.C.

(57) ABSTRACT

Improving semiconductor chip yield and reliability by connecting adjacent metal traces that are on a same network with metal shorts. This reduces and/or eliminates the need for redundant vias formerly employed in semiconductor chip design. Additionally, the metal shorts are placed in conformance with one or more pre-determined design rules. Once placed, the metal shorts are checked to ensure that each metal short connects groundrule clean, thereby ensuring the placement is correct-by-construction.

4 Claims, 6 Drawing Sheets

SYSTEM AND METHOD TO IMPROVE CHIP YIELD, RELIABILITY AND PERFORMANCE

BACKGROUND OF THE INVENTION

1. Field of the Invention

The invention relates to semiconductor chips, and more particularly to a method and system which traces on a same network are shorted to improve chip yield and performance.

2. Background Description

Chip designers have long attempted to improve chip yield and reliability while simultaneously reducing wiring resistance and wiring opens by including one or more redundant vias in the chip design. However, adding redundant vias does not satisfactorily solve the aforementioned problems because adding extra vias increases path length and wiring resistance, which reduces the chip's overall yield. Using vias to connect devices on a semiconductor chip cause other problems. For example, the capacitance inherent in vias can change the characteristic impedance of a trace. Additionally, if vias are positioned close to metal traces or other devices, device-electromagnetic-circuit coupling may result. Such coupling may adversely affect the performance of a neighboring MOSFET.

Various types of layered substrates may be used to form integrated circuits. For example, a two layer substrate may include two metal (signal) traces separated by an organic or ceramic dielectric. Traces on the top layer can be connected to traces on the bottom layer using vias, which may be drilled. As another example, a built-up substrate consisting of three or more layers may be constructed by building it up, one layer at a time. Illustratively, a four-layer substrate is similar to the two-layer substrate, except that the four-layer substrate includes two additional layers, usually ground and power planes, which are sandwiched between the top and bottom layers. In such a substrate, vias are typically laser-cut to a significantly smaller diameter than the drilled vias commonly used in two-layer substrates.

A significant disadvantage to using vias is that such use creates lengthy electrical paths. FIG. 1 illustrates one such conventional electrical path. As shown, the electrical path begins with metal trace 107 and flows through via 111 to the metal trace 115 positioned on the next layer. From metal trace 115, the electrical path flows through a second via 113, which completes the path by connecting to the metal trace 109, which is formed on the same layer of the substrate as metal trace 107. Such a long electrical path is practical where metal traces (or devices) on different layers need to be connected with each other. However, in cases where two traces on the same network are positioned adjacent each other on the same substrate layer, using vias to connect one of the adjacent traces to the other creates an unnecessarily long electrical path. The long electrical path not only occupies a chip's volume, but also increases resistance, which decreases chip yield. A solution is needed that reduces or eliminates the number of redundant vias and decreases wiring resistance, while also improving overall chip yield and reliability. Accordingly, a solution is needed that decreases wiring resistance, rendering associated non-redundant vias unnecessary, and thus reduces or eliminates the number of redundant vias needed, while also improving overall chip yield and reliability.

SUMMARY OF THE INVENTION

In one aspect of the invention, machine-executable instructions embodied in a machine-readable memory or storage device are used to build a network in a previously created semiconductor chip design. The machine-executable instructions include one or more design parameters or rules, such as wide-metal spacing and other constraints. Two or more adjacent metal traces that are in the same network use more, and possibly all layers in a metal stack, determine the network. In the embodiments of the invention, the whole stack or partial stack may be used to find the network. Then the adjacent shapes may be found on layers within the network where a short can be added. As used herein, "adjacent metal traces" means two separate traces at a particular level. For example, two vertical segments of a U-shaped trace are not adjacent metal traces because they are connected to each other. A shape representing a metal short, and complying with the one or more design parameters or rules, is generated and positioned to connect the two adjacent metal traces. The connection may be checked to ensure that the metal short connects groundrule clean. A via bypassed by the metal short may be left in the final chip design or deleted.

In one embodiment, the invention includes a semiconductor chip design which has at least two adjacent devices on a same network. The chip also includes an electrical path on one layer connecting the two adjacent devices.

In another embodiment, the invention includes a method. The method may include building a network on a layer of a semiconductor chip. The method further determines one or more rules that govern placement of devices on the network, and creating, in conformance with the one or more rules, an electrical path on the layer between two adjacent devices that are both on the network.

Embodiments of the invention may be performed by a computer program product comprising a computer usable medium having readable program code embodied in the medium. The computer program product may include at least one component to build a network on a layer of a semiconductor chip, and determine one or more rules that govern placement of a metal short on the network. The computer program product may place the metal short on the network, in conformance with the one or more rules. Placement of the metal short decreases resistance and improves chip yield and reliability.

DETAILED DESCRIPTION OF THE INVENTION

The invention is directed to improving semiconductor chip yield and reliability by placing metal shorts to connect adjacent metal traces that are on a same network. This reduces and/or eliminates the need for redundant vias formerly employed in semiconductor chip design. Additionally, the metal shorts are placed in conformance with one or more pre-determined design rules. Once placed, the metal shorts are checked to ensure that each metal short connects groundrule clean, thereby ensuring the placement is correct-by-construction.

Figure 1:
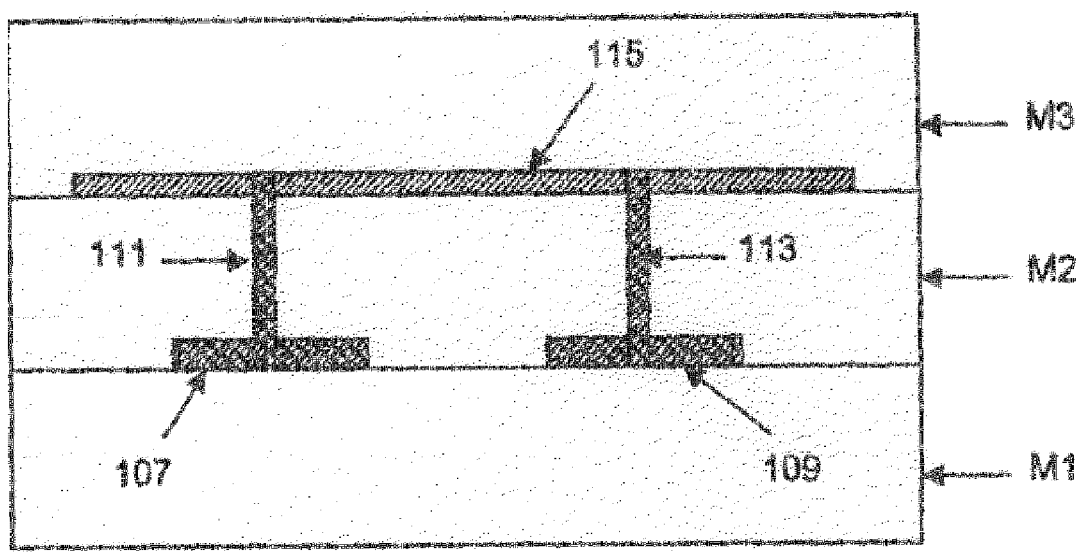
FIG. 1 is a cross-sectional view of a substrate illustrating a conventional current path.
Figure 2:
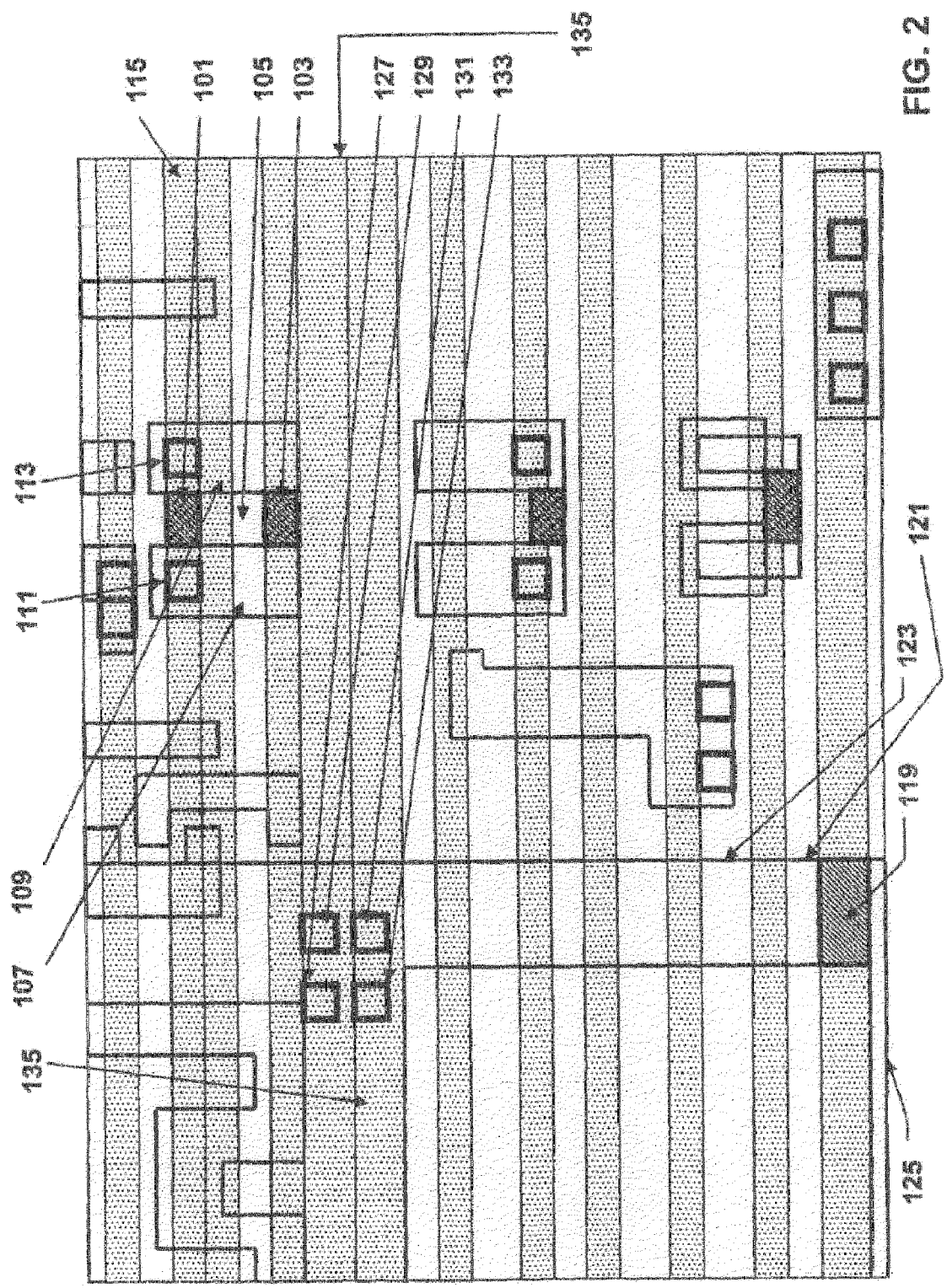
FIG. 2 is a plan view of a portion of a chip design that illustrates placement of metal shorts about an enclosed area, according to one embodiment of the invention.

FIG. 2 is a plan view of a portion of a chip design that illustrates placement of metal shorts 101 and 103 about an enclosed area 105, according to one embodiment of the invention. As shown, two substantially parallel metal traces 107 and 109 are formed on a same stack level, M1. Vias 111 and 113, formed in metal traces 107 and 109, respectively, formerly connected traces 107 and 109 through a metal layer 115 formed on the stack level, M2. The vias may now be eliminated from the design, in embodiments. In alternate embodiments, the vias are not used for connections in a network.

In the embodiment of FIG. 2, the metal short 101 is positioned at one end of the pair of parallel metal traces 107 and 109 and the metal short 103 is positioned at the other end of the pair of traces 107 and 109. A space 117 is formed between the metal shorts 101 and 103 in order to prevent a wide metal spacing violation.

The metal shorts 101 and 103 each create an electrical path between the trace 107 and the trace 109. This is advantageous since the electrical path formerly provided by vias 111 and 113 is longer and has higher resistance than an improved electrical path created by the metal shorts 101 and 103. Thus, in one embodiment, the improved electrical path which connects two adjacent traces (or devices) is shorter and has less path resistance than a conventional electrical path that connects the two adjacent traces (or devices) using at least one via and a metal trace connected thereto. Alternatively, the improved electrical path (e.g., metal short) may connect a trace with an adjacent device on the same network.

Figure 3:
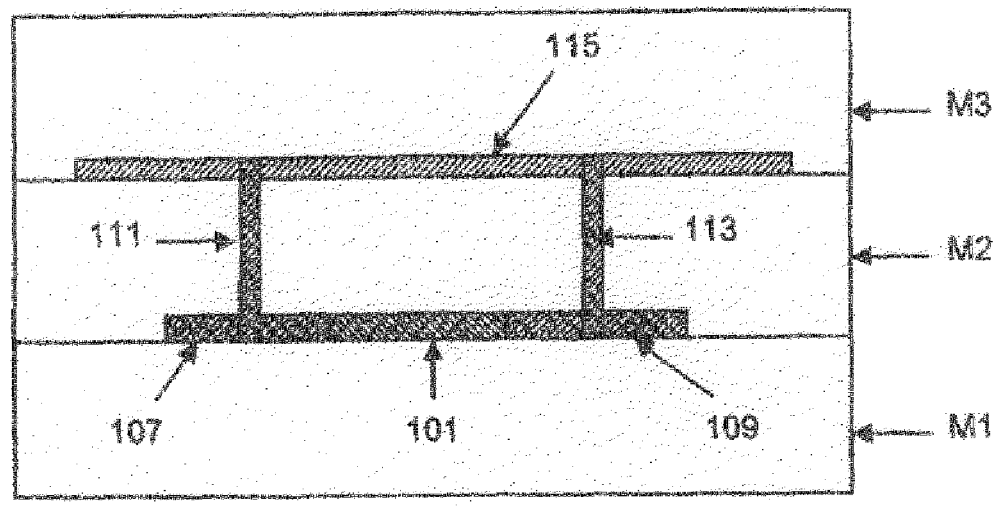
FIG. 3 is a cross-sectional view of a portion of the chip design of FIG. 1 along line 3-3", showing placement of a metal short, according to one embodiment of the invention.
Figure 4:
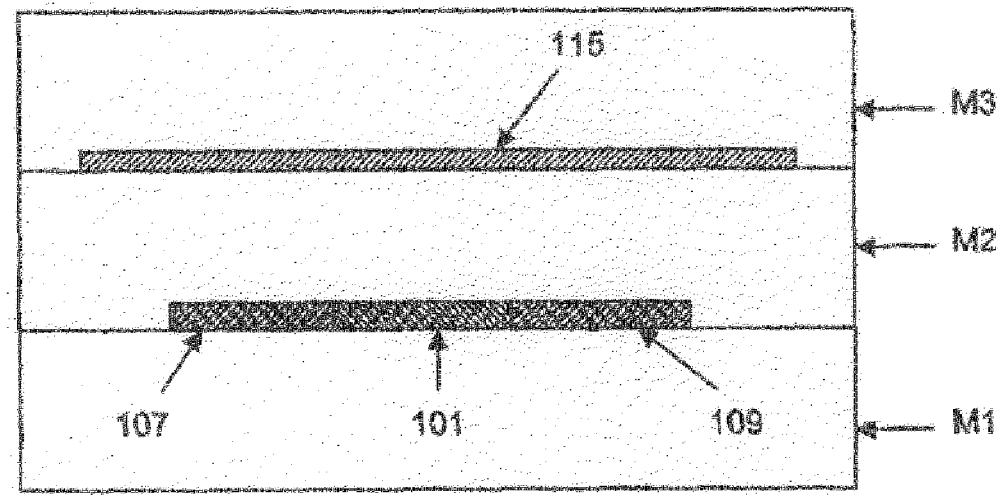
FIG. 4 is a cross-sectional view of a portion of the chip design of FIG. 1 along line 4-4", showing placement of a metal short and removal of redundant vias, according to one embodiment of the invention.

The improved electrical path is further shown in FIGS. 3 and 4, which are cross-sectional views of a substrate containing at least one metal short 101. As shown in these figures, once the metal short 101 is positioned to connect the metal traces (or devices) 107 and 109, the vias 111 and 113 may remain in (FIG. 3) or may be deleted from the chip design (FIG. 4). However, if the vias 111 and 113 remain, they will no longer function as a conventional electrical path.

Referring still to FIG. 2, other shorts, such as the metal short 119, may also be used alone or in combination with metal shorts 101 and 103. In one embodiment, metal short 119 connects an end 121 of a trace 123 on the stack layer M1 with a portion of another trace 125, also on the stack layer M1, which is positioned orthogonal to the end 121 of the trace 123. As shown, the metal short 119 has a width approximately equal to that of the end 121 of the trace 123. Vias 127, 129, 131, and 133 may remain, which formerly connected trace 123 to trace 125, and which also connected to a metal layer 135 formed on the stack layer M2. However, in other alternate designs, the vias may be eliminated, if so desired. Providing the metal short 119 reduces the electrical path length significantly, and thus reduces path resistance and improves chip yield.

Figure 5:
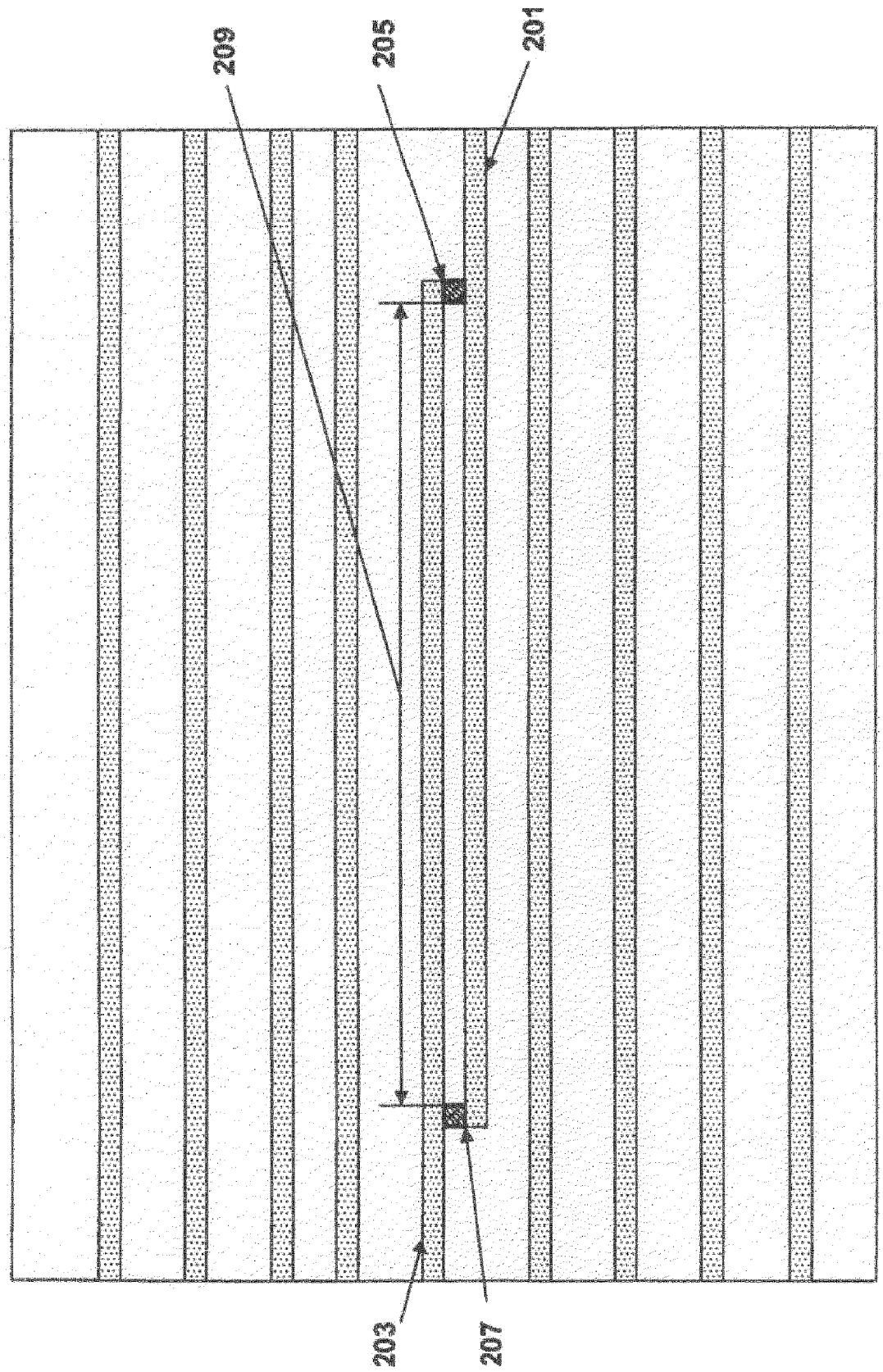
FIG. 5 is a plan view of a portion of another chip design that illustrates placement of metal shorts on two parallel traces, according to one embodiment of the invention.

FIG. 5 is a plan view of another chip design, according to one embodiment of the invention. As shown, a pair of substantially parallel and overlapping metal traces 201 and 203 formed on the same stack layer are provided on the same network. In this embodiment, the traces may be shorted together using metal shorts 205 and 207. Illustratively, the metal shorts 205 and 207 are shown placed at the end of each metal trace 201 and 203. This configuration provides a redundant current path in the event that one of the metal traces 201 or 203 develops a break (e.g., a metal open).

It should be understood that more than two metal shorts is also contemplated by the invention. Likewise, one short at the end of the traces may also work in the manner intended by the invention. More specifically, although a plurality of metal shorts may be placed with a predetermined frequency (every 1000 microns, for example) along the overlapping portion (denoted by shaded area 209) of the metal traces 201 and 203, a single short may also be used in the environment. A continuous metal short is preferably not used to fill all or substantially all the overlapping portion 209, since in some instances, such a configuration may violate wide metal spacing rules, minimum space rules, or other pre-determined chip design parameters.

Figure 6:
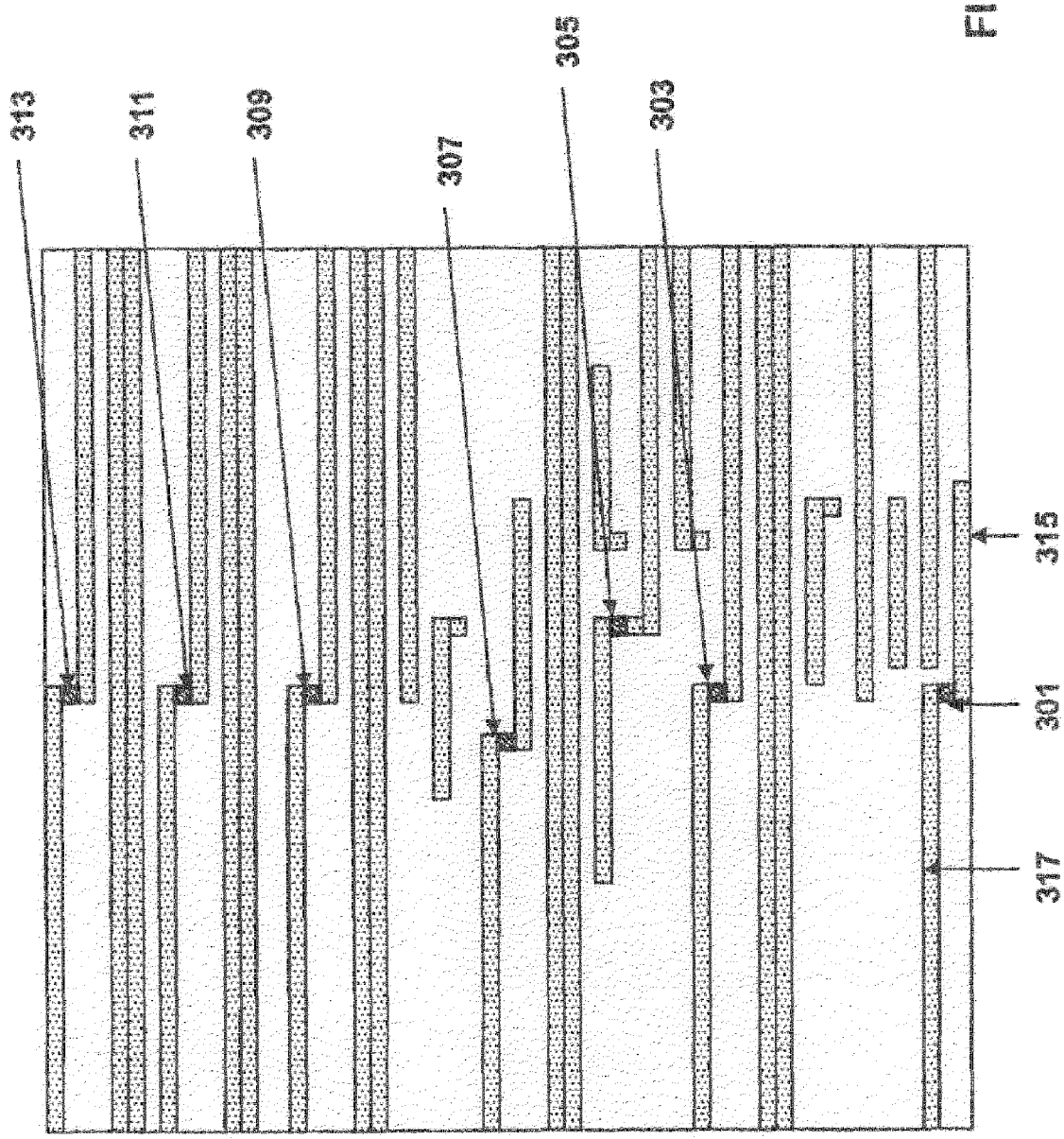
FIG. 6 is a plan view of a portion of another chip design that illustrates placement of a metal short between ends of adjacent metal traces, according to one embodiment of the invention.

Such rules and parameters are known to persons of ordinary skill in the art and will vary depending on a variety of factors such as, but not limited to, the type of chip being designed, the materials used to form various chip components, etc. Exemplary rules include, but are not limited to:

minimum enclosed area: >=2u2
minimum area: >=1.92u2
minimum width: >=0.8u
minimum space: >=0.6u
minimum space for metal: <14.4u wide >=1.2u FIG. 6 is a plan view of another chip design containing one or more metal shorts 301, 303, 305, 307, 309, 311, and 313, according to one embodiment of the invention. Illustratively, the metal short 301 connects the metal traces 315 and 317, the ends of which overlap by approximately the width of the metal short 301. The remaining metal shorts 303, 305, 307, 309, 311, and 313, and their associated pairs of metal traces, are configured in a similar manner.

Figure 7:
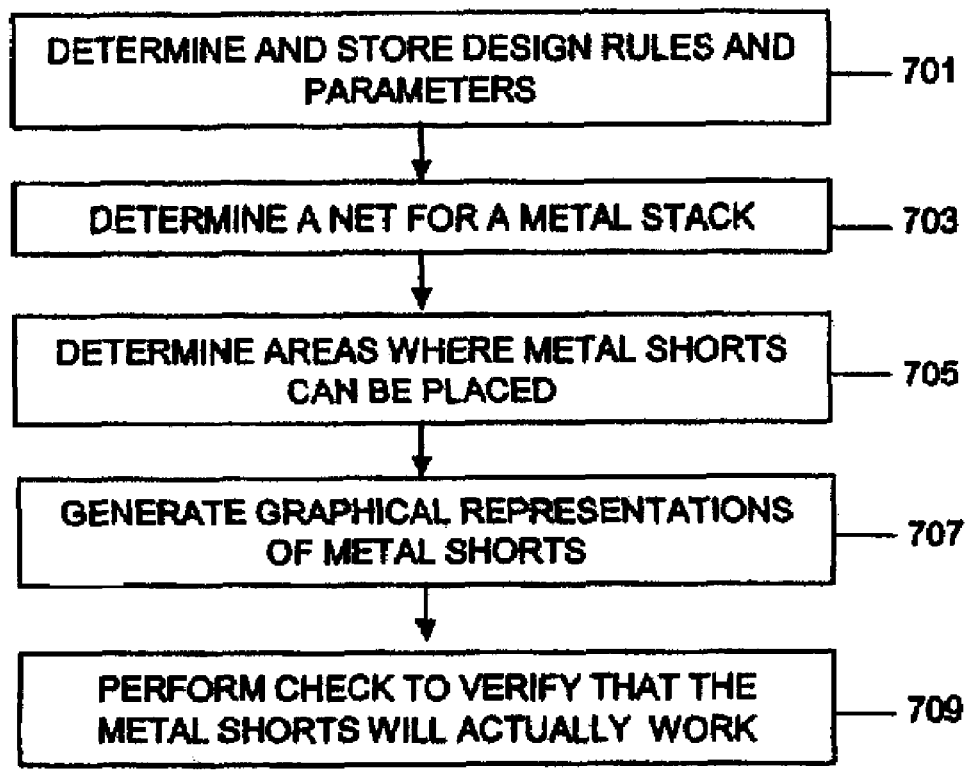
FIG. 7 is a flowchart illustrating a method of placing metal shorts in a chip design, according to one embodiment of the invention.

FIG. 7 is a flow chart illustrating a method of determining placement of one or more metal shorts, according to one embodiment of the invention. The method steps herein described may be performed in any order, and are not limited to the sequential sequence shown. The steps of FIG. 7 (and all the other Figures employing flowcharts) may be implemented on computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network. The steps of FIG. 7 (and the other flowchart Figures) may also be implemented by the embodiment of FIG. 2.

As represented by block 701, a pre-determined number of design rules and parameters are determined and stored in a database or other type of machine-readable medium. Illustratively, these rules and parameters may include, but are not limited to, wide metal spacing rules, minimum enclosed area rules, minimum space rules, minimum area rules, and the like. As mentioned previously, such rules are well known to persons of ordinary skill in chip design, and will vary from chip to chip.

As represented in block 703, a single network (for an entire metal stack) of a semiconductor chip is determined. In one embodiment, the network is determined using machine-executable instructions that are executed by a computer processor in response to a user's prompt(s). Once the network is determined, an electronic or digital graphical representation of the network may be displayed on a display device, such as a flat panel display, for viewing. The graphical representation may include the use of color. For example, traces appearing on a stack layer M2 may be colored yellow, while traces appearing on another layer (such as M1, for example) may be colored blue. In one embodiment, vias may be colored green. However, virtually any color-coding schema may be used with the invention. In another embodiment, a paper-based graphical representation of a semiconductor chip may be used to determine a desired network.

As represented by block 705, areas where one or more metal shorts can be placed to shorten current paths and bypass vias are also determined. For example, all spaces between traces and/or devices that are on the same network may be filled in with a pre-determined color. In one embodiment, the determination of where one or more shorts can be placed is preferably performed by the computer processor executing machine-executable instructions. However, such a determination may also be made manually by the user. The step represented by block 705 is optional, and may be omitted in another embodiment, in which case the step represented by block 707 would be performed instead.

As represented by block 707, graphical representations of one or more metal shorts are generated and displayed on the display device. The size, shape, and composition of each metal short is made to conform to one or more of the pre-determined rules represented by block 701. Each short is, in one embodiment, positioned in an area determined by the step represented by block 705. The metal shorts may be any suitable color, and in one embodiment, are red.

As represented by block 709, a check is performed to verify that the positioned graphical representations of metal shorts will actually create shorts when the chip is manufactured. Additionally, the graphical representations of metal shorts are processed to ensure that each short connects groundrule clean. In this manner, the position of each metal short is automatically correct-by-construction, which is a significant improvement over the known Layout vs. Schematic (LVS) methodology. In fact, where a chip containing several million transistors is concerned, LVS, due to its hierarchical nature, may fail. Embodiments of the invention, however, are able to map such a chip because placement of each short is guaranteed correct-by-construction.

Figure 8:
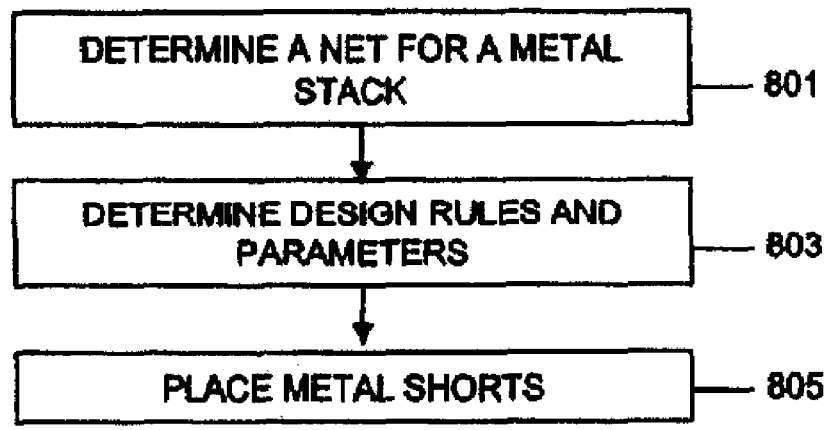
FIG. 8 is a flowchart illustrating another method of placing metal shorts in a chip design, according to one embodiment of the invention.

FIG. 8 is a flowchart illustrating another method of placing metal shorts in a chip design, according to one embodiment of the invention. The method steps herein described may be performed in any order, and are not limited to the sequential sequence shown. Similar to the embodiment of FIG. 7, the steps can be performed in any order, and may be performed by a computer that executes one or more machine-readable instructions.

As represented by block 801, a single network (for an entire metal stack) is determined. As represented by block 803, a pre-determined number of design rules and parameters are determined and used to adjust the size, shape, and location of one or more metal shorts. Illustratively, these rules and parameters may include, but are not limited to, wide metal spacing rules, minimum enclosed area rules, minimum space rules, minimum area rules, and the like. As represented by block 805, one or more metal shorts (or graphical representations thereof) are created between adjacent traces (or devices) that are on the same layer and also on the same network.

While some exemplary embodiments of this invention have been described in detail, those skilled in the art will recognize that there are many possible modifications and variations which may be made in these exemplary embodiments while yet retaining many of the novel features and advantages of the invention.

What is claimed is:

1. A method, comprising:
    building a network on a layer of a semiconductor chip;
    determining one or more rules that govern placement of devices on the network;
    creating, in conformance with the one or more rules, an electrical path on the layer between two adjacent metal traces that are both on the network,
    wherein the step of creating an electrical path comprises placing a metal short on the network, wherein placement of the metal short decreases resistance and improves chip yield and reliability, and further comprises one of: connecting the metal short between end portions of the two adjacent metal traces, connecting the metal short between one metal trace and an end portion of an adjacent metal trace, and connecting one or more metal shorts along overlapping end portions of the metal traces; and
    spacing the one or more metal shorts at pre-determined intervals.

2. The method of claim 1, wherein the step of creating an electrical path further comprises bypassing one or more vias that connect the two adjacent devices to a metal trace formed on a second layer of the semiconductor chip.

3. The method of claim 2, wherein the step of creating an electrical path further comprises removing the one or more vias.

4. The method of claim 1, wherein the step of creating an electrical path further comprises minimizing resistance and improving chip yield by minimizing a length of the electrical path.

* * * * *